United States Patent
Hayakawa

(10) Patent No.: US 8,969,739 B2
(45) Date of Patent: Mar. 3, 2015

(54) SEMICONDUCTOR DEVICE

(71) Applicant: Kabushiki Kaisha Toshiba, Tokyo (JP)

(72) Inventor: Toshiyuki Hayakawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 13/775,411

(22) Filed: Feb. 25, 2013

(65) Prior Publication Data

US 2014/0168882 A1    Jun. 19, 2014

Related U.S. Application Data

(60) Provisional application No. 61/737,295, filed on Dec. 14, 2012.

(51) Int. Cl.
  *H01L 23/48*    (2006.01)
  *G06F 1/16*    (2006.01)

(52) U.S. Cl.
  CPC ...................................... *G06F 1/16* (2013.01)
  USPC ............................ 174/527; 361/752; 361/759

(58) Field of Classification Search
  USPC ...................... 174/527; 361/679.32, 752, 759
  See application file for complete search history.

(56) References Cited

U.S. PATENT DOCUMENTS

| | | | | |
|---|---|---|---|---|
| 7,558,069 | B2 * | 7/2009 | Chung | 361/737 |
| 7,679,008 | B2 * | 3/2010 | Lee | 361/737 |
| 7,830,666 | B2 * | 11/2010 | Hiew et al. | 361/737 |
| 8,071,895 | B2 * | 12/2011 | Shiu et al. | 174/521 |
| 8,139,366 | B2 * | 3/2012 | Wu | 361/759 |
| 8,391,014 | B2 * | 3/2013 | Sung et al. | 361/759 |
| 2002/0177335 | A1 | 11/2002 | Tsuchioka | |
| 2006/0002096 | A1 * | 1/2006 | Wang et al. | 361/752 |
| 2006/0176673 | A1 * | 8/2006 | Roveda et al. | 361/752 |
| 2007/0066102 | A1 | 3/2007 | Takemoto et al. | |

FOREIGN PATENT DOCUMENTS

| | | |
|---|---|---|
| JP | 2003-46273 | 2/2003 |
| JP | 2007-109198 | 4/2007 |
| JP | 2007-249685 | 9/2007 |

* cited by examiner

*Primary Examiner* — Hung V Ngo
(74) *Attorney, Agent, or Firm* — Oblon, McClelland, Maier & Neustadt, L.L.P.

(57) ABSTRACT

According to one embodiment, a semiconductor device includes a housing including a first wall and a second wall opposite to the first wall, a board in the housing, a first supporter provided on the first wall and configured to support an end of the board in a direction substantially parallel to the first wall, a stopper in the housing, the stopper configured to support the board, and a second supporter provided on the second wall and configured to support the stopper.

9 Claims, 13 Drawing Sheets

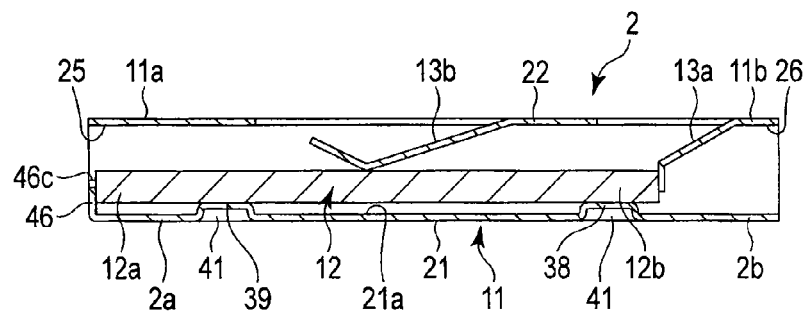
F I G. 17
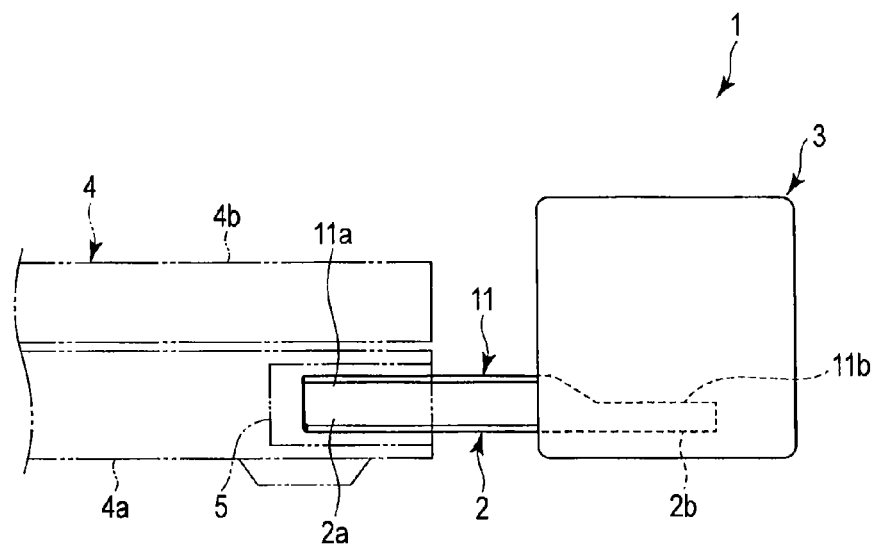
F I G. 18

SEMICONDUCTOR DEVICE

CROSS-REFERENCE TO RELATED APPLICATIONS

This application claims the benefit of U.S. Provisional Application No. 61/737,295, filed Dec. 14, 2012, the entire contents of which are incorporated herein by reference.

FIELD

Embodiments described herein relate generally to semiconductor devices.

BACKGROUND

A USB (Universal Serial Bus) memory including a metal housing has been provided.

There is a demand for semiconductor devices with high reliability.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 17 is a cross-sectional view illustrating a device main unit according to a third embodiment;

FIG. 18 is a side view illustrating a semiconductor device according to a fourth embodiment;

DETAILED DESCRIPTION

Figure 1:
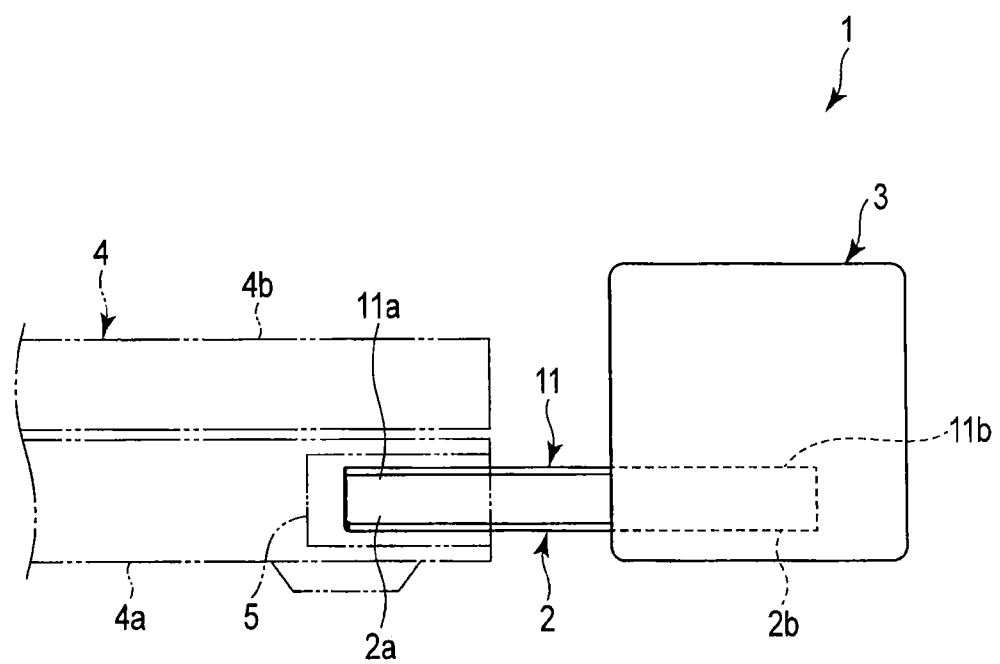
FIG. 1 is a side view illustrating a semiconductor device according to a first embodiment.

Various embodiments will be described hereinafter with reference to the accompanying drawings.

In general, according to one embodiment, a semiconductor device comprises: a housing comprising a first wall and a second wall opposite to the first wall; a board in the housing; a first supporter provided on the first wall and configured to support an end of the board in a direction substantially parallel to the first wall; a stopper in the housing, the stopper configured to support the board; and a second supporter provided on the second wall and configured to support the stopper.

In this specification, some components are expressed by two or more terms. Those terms are just examples. Those components may be further expressed by another or other terms. And the other components which are not expressed by two or more terms may be expressed by another or other terms.

The drawings are schematically illustrated. In the drawings, in some cases, the relation between a thickness and planar dimensions or the ratio of the thickness of each layer may be different from the actual relation or ratio. In addition, among figures in the drawings, the relationships of dimensions or the ratios may be different.

First Embodiment

FIGS. 1 to 9 illustrate a semiconductor device 1 according to a first embodiment. The semiconductor device 1 is, for example, a semiconductor memory device and an example of the semiconductor memory device is a USB memory.

Figure 2:
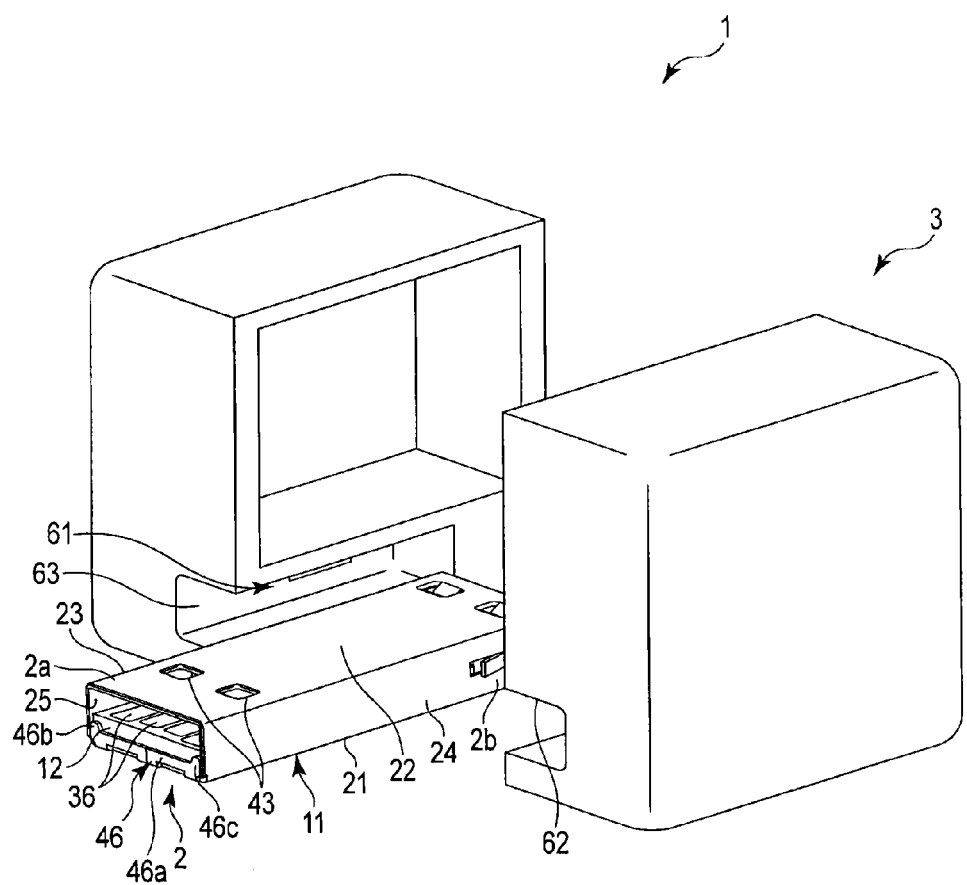
FIG. 2 is an exploded perspective view illustrating a portion of the semiconductor device illustrated in FIG. 1.

FIG. 1 is a side view illustrating the semiconductor device 1 according to this embodiment. FIG. 2 is an exploded perspective view illustrating a portion of the semiconductor device 1. As illustrated in FIGS. 1 and 2, the semiconductor device 1 includes a device main unit 2 (main portion) and a case 3 (a cover or an accessory). The case 3 is for, for example, decoration, but is not limited thereto.

As illustrated in FIG. 1, the device main unit 2 includes a first end 2a and a second end 2b opposite to the first end 2a. The first end 2a protrudes toward the outside of the case 3 and is exposed to the outside of the semiconductor device 1. The case 3 is attached (connected) to the second end 2b. The second end 2b is disposed in the case 3 and is covered with the case 3. That is, the second end 2b is concealed from the outside of the semiconductor device 1.

As illustrated in FIG. 1, the first end 2a of the device main unit 2 can be connected to a connector 5 of an external apparatus 4. An example of the external apparatus 4 is a notebook portable computer (notebook PC). The external apparatus 4 includes, for example, a first housing 4a and a second housing 4b which can be rotated with respect to the first housing 4a. The case 3 of the semiconductor device 1 is provided at a position where the case 3 does not contact the second housing 4b when the device main unit 2 is connected to the connector 5 of the external apparatus 4.

The external apparatus 4 to which the semiconductor device 1 can be connected is not limited to the notebook PC, but may be various kinds of electronic apparatuses, such as a tablet terminal and other computers. The case 3 may not be an essential component, but the semiconductor device (semiconductor memory device) may include only the device main unit 2.

Figure 3:
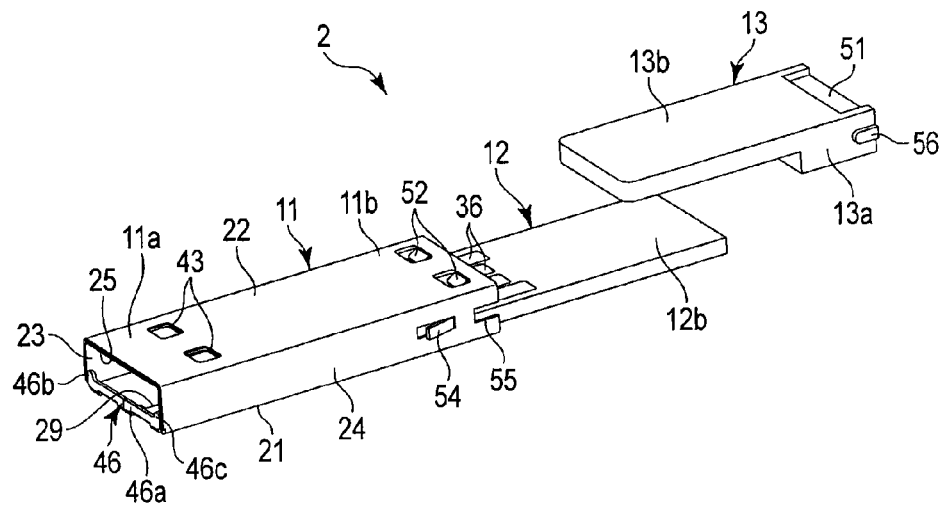
FIG. 3 is an exploded perspective view illustrating a portion of a device main unit illustrated in FIG. 2.
Figure 4:
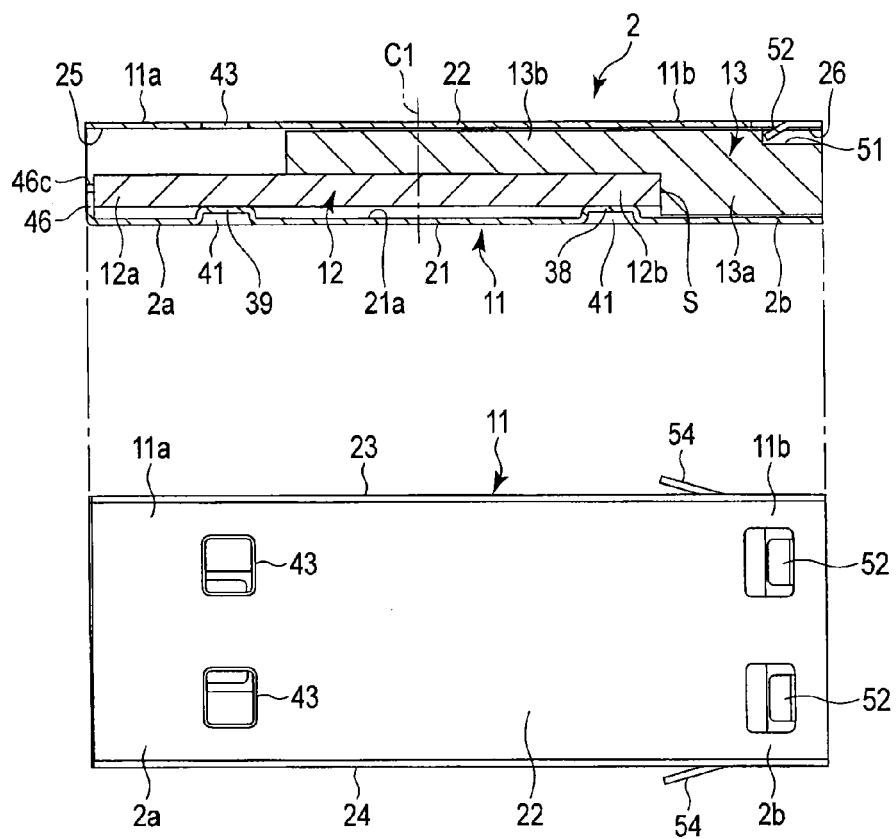
FIG. 4 is a diagram illustrating the cross-section and the upper surface of the device main unit illustrated in FIG. 2.

FIG. 3 is an exploded perspective view illustrating a portion of the device main unit 2. FIG. 4 is a diagram illustrating the cross-section and the upper surface of the device main unit 2. As illustrated in FIGS. 3 and 4, the device main unit 2 includes a housing 11, a board 12 (board module), and a stopper 13.

The housing 11 (a shell, a case, a connector case, an external body, an outer frame, a cylinder, or a protective portion) is, for example, a cylinder having a substantially rectangular shape in a cross-sectional view. For example, the housing 11 is made of a metal material, but the material forming the housing 11 is not limited thereto. For example, the housing 11 may be made of hard plastic or other materials. The housing 11 includes, for example, a first wall 21, a second wall 22, a third wall 23, and a fourth wall 24 and the front and rear sides thereof are opened.

Specifically, the first wall 21 is, for example, a lower wall (bottom wall) and extends so as to be substantially flat except for protrusions 38 and 39 which will be described below. The second wall 22 is opposite to the first wall 21. The second wall 22 is, for example, an upper wall and extends substantially in parallel to the first wall 21.

The third wall 23 is a first side wall and extends in a direction (for example, a direction substantially perpendicular to) intersecting the first wall 21. The third wall 23 connects the first wall 21 and the second wall 22. The fourth wall 24 is opposite to the third wall 23. The fourth wall 24 is a second side wall and extends substantially in parallel to the third wall 23. The fourth wall 24 connects the first wall 21 and the second wall 22. In this way, the cylindrical housing 11 is formed.

As illustrated in FIGS. 3 and 4, first and second openings 25 and 26 are defined between the first wall 21 and the second wall 22. The first opening 25 is disposed at the first end 2a of the device main unit 2. A terminal 28 (external terminal in FIG. 7) of the connector 5 of the external apparatus 4 is inserted into the first opening 25. The second opening 26 is disposed on the side opposite to the first opening 25, that is, at the second end 2b of the device main unit 2.

As illustrated in FIG. 3, a bonding portion 29 which extends in the longitudinal direction of the housing 11 is provided at the center of the first wall 21 in the width direction. For example, the housing 11 is formed by bending a plate (for example, a metal plate) in a cylindrical shape and bonding both ends of the plate at the center of the first wall 21 in the width direction.

As illustrated in FIG. 4, the board 12 (a module, a board module, an electronic component, a package component, or a functional component) is disposed in the housing 11. The board 12 is a plate having, for example, a substantially rectangular shape. The board 12 extends between the first wall 21 and the second wall 22. The board 12 is arranged substantially in parallel to the first wall 21 along the first wall 21. The board 12 includes a first end 12a and a second end 12b opposite to the first end 12a.

Figure 5:
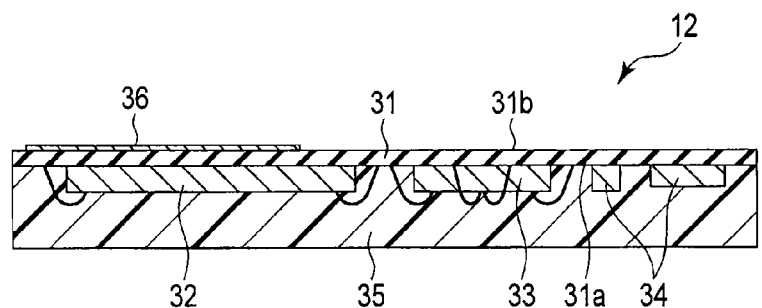
FIG. 5 is a cross-sectional view illustrating a board (board module) illustrated in FIG. 4.

FIG. 5 is a cross-sectional view illustrating the board 12. As illustrated in FIG. 5, the board 12 according to this embodiment is a SiP (System in Package) memory module. The board 12 includes a substrate (i.e., board in a narrow sense) 31, a semiconductor chip 32, a controller chip 33, an electronic components 34, and a sealing resin 35.

The substrate 31 is made of, for example, a glass epoxy resin. The substrate 31 comprises a wiring pattern. The substrate 31 includes a first surface 31a and a second surface 31b opposite to the first surface 31a. The first surface 31a faces the inner surface of the first wall 21. The second surface 31b faces the inner surface of the second wall 22.

The semiconductor chip 32, the controller chip 33, and the electronic components 34 are mounted on the first surface 31a of the substrate 31. The semiconductor chip 32 and the controller chip 33 are electrically connected to the first surface 31a of the substrate 31 by, for example, wire bonding. The semiconductor chip 32 is, for example, an arbitrary memory chip and is, for example, a non-volatile memory chip. An example of the semiconductor chip 32 is a NAND flash memory chip.

The controller chip 33 controls the operation of the semiconductor chip 32. The controller chip 33 controls the writing of data to the semiconductor chip 32, the reading of data from the semiconductor chip 32, or the erasing of data from the semiconductor chip 32 in response to, for example, external commands and manages the storage state of data in the semiconductor chip 32. The electronic component 34 is a passive component, such as a resistor or a capacitor, but is not limited thereto.

The sealing resin 35 (a sealing portion, a resin portion, a mold, or a mold resin) is, for example, an epoxy resin. The sealing resin 35 covers the substrate 31, the semiconductor chip 32, the controller chip 33, and the electronic components 34.

Terminals 36 (external connection terminals) are provided on the second surface 31b of the substrate 31. The terminal 36 is a conductor layer (metal layer) provided on the second surface 31b and is, for example, a gold terminal. The terminal 36 can contact the terminal 28 (external terminal) of the connector 5 of the external apparatus 4 which is inserted through the first opening 25. The terminal 36 is exposed to the outside of the substrate 31 and faces the inner surface of the second wall 22.

Figure 6:
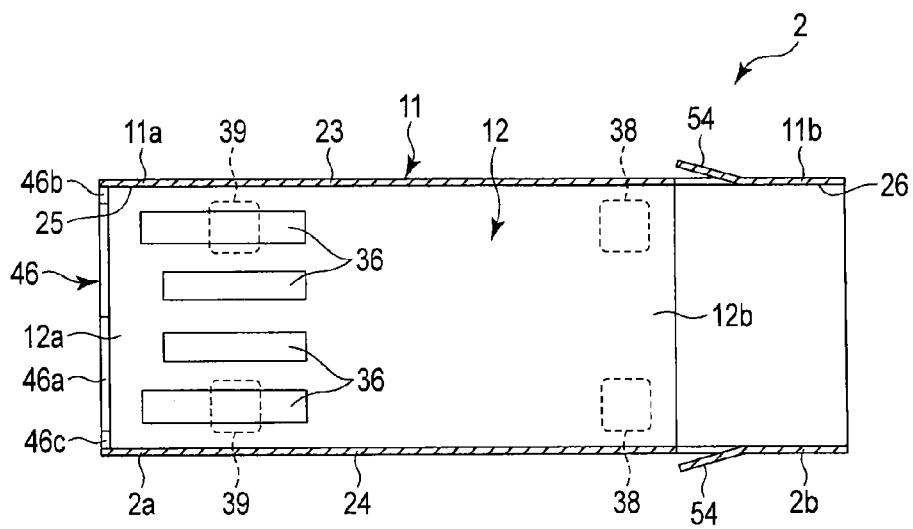
FIG. 6 is a cross-sectional view illustrating the inside of the device main unit illustrated in FIG. 2.

As illustrated in FIG. 4, first and second protrusions 38 and 39 which protrude toward the board 12 are provided on the first wall 21 of the housing 11. As illustrated in FIG. 6, a plurality of (for example, a total of four) first and second protrusions 38 and 39 are provided. The first and second protrusions 38 and 39 are formed by, for example, pressing (for example, punching) the first wall 21. That is, the first and second protrusions 38 and 39 are formed by pressing the first wall 21 such that a portion thereof is recessed into the housing 11. For convenience of explanation, the stopper 13 is not illustrated in FIG. 6, FIGS. 10 to 13, and FIG. 15.

As illustrated in FIGS. 4 and 6, two first protrusions 38 are provided in the vicinity of, for example, the second end 12b of the board 12. That is, the first protrusions 38 are provided in the vicinity of a contact surface S between the second end 12b of the board 12 and the stopper 13.

Two second protrusions 39 are disposed between the first protrusions 38 and the first opening 25. In other words, the first protrusions 38 are disposed between the second protrusions 39 and the stopper 13. As illustrated in FIG. 4, the first and second protrusions 38 and 39 support the board 12 such that the board 12 is separated from the first wall 21 (a surface 21a (inner surface) of the first wall 21). That is, the first and second protrusions 38 and 39 increase the height of the board 12 relative to the first wall 21.

Figure 7:
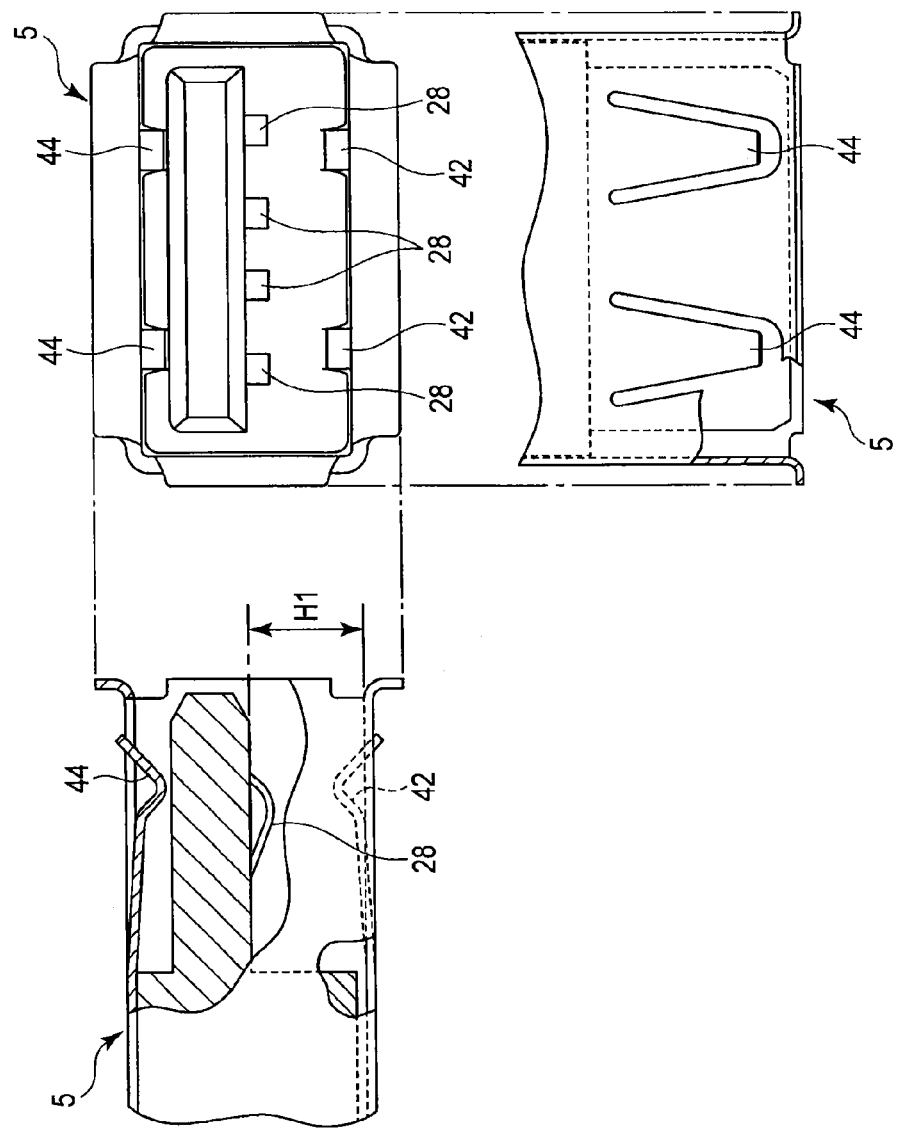
FIG. 7 is a diagram illustrating an example of a connector of an external apparatus according to the first embodiment.
Figure 8:
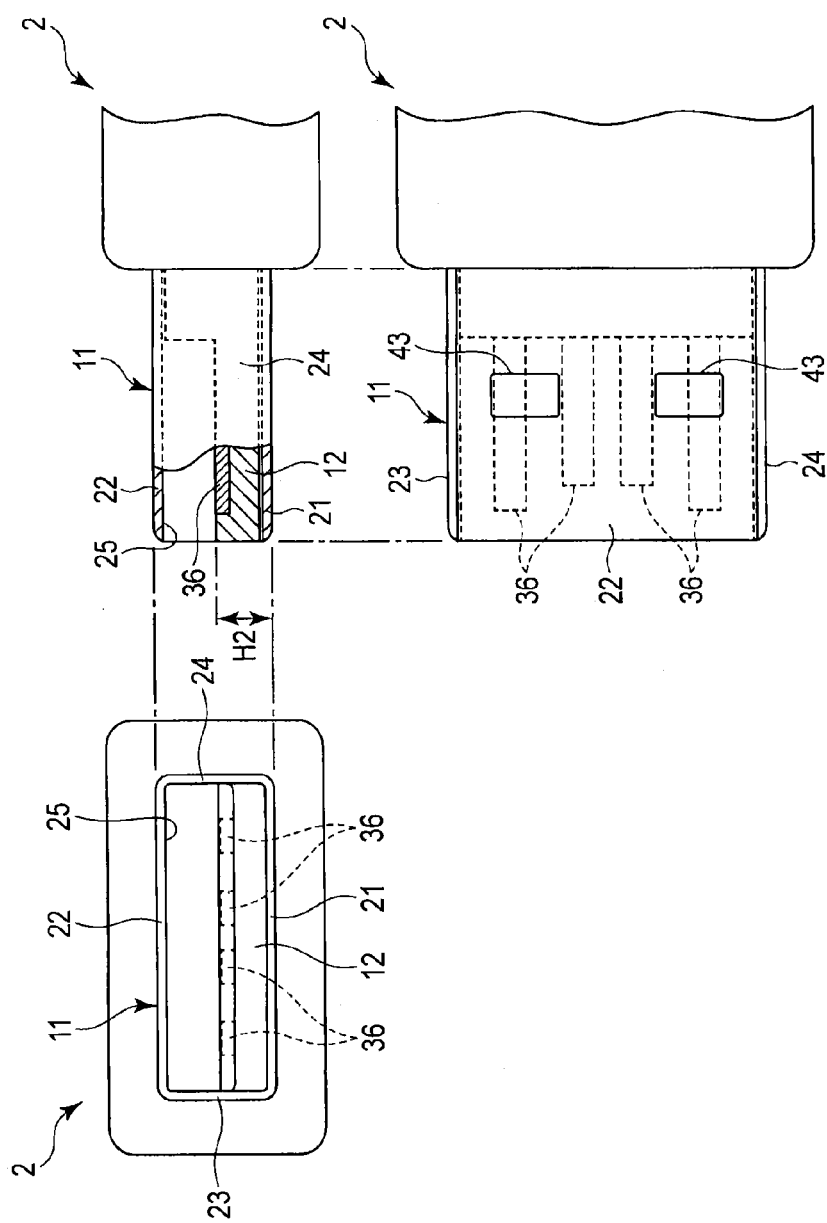
FIG. 8 is a diagram illustrating an example of a connector of the semiconductor device according to the first embodiment.

FIGS. 7 and 8 illustrate the USB standard of the semiconductor device 1 according to this embodiment. Specifically, FIG. 7 illustrates the connector 5 (a female connector or a host) of the external apparatus 4. As illustrated in FIG. 7, the height of the terminal 28 (hereinafter, referred to as an external terminal 28) of the connector 5 is defined to a predetermined value (predetermined position) H1 according to the standard. FIG. 8 illustrates a male connector which can be connected to the connector 5. As illustrated in FIG. 8, the height of the terminal 36 which can be connected to the external terminal 28 is defined to a predetermined value (predetermined position) H2 according to the standard.

The board 12 according to this embodiment is thinned in order to reduce, for example, the material cost of the sealing resin 35. The first and second protrusions 38 and 39 provided on the first wall 21 lift the board 12 to position the terminals 36 of the thinned board 12 at a necessary height. The first and second protrusions 38 and 39 may be provided on the board 12, instead of the first wall 21 or in addition to the first wall 21.

In this embodiment, as illustrated in FIG. 4, recess 41 are provided in the outer surface of the first wall 21 by the first and second protrusions 38 and 39. The recess 41 is fitted to a first fitting portion 42 (see FIG. 7) of the connector 5 of the external apparatus 4. In addition, openings 43 are provided in the second wall 22. A second fitting portion 44 (see FIG. 7) of the connector 5 of the external apparatus 4 is fitted to the opening 43. In this way, the semiconductor device 1 connected to the connector 5 is stably held by the connector 5.

Next, the first supporter 46 will be described in detail. As illustrated in FIGS. 2 to 4, a first supporter 46 is provided at the end of the first wall 21. The first supporter 46 protrudes from the first wall 21 in a direction (for example, a direction substantially perpendicular to) intersecting the direction in which the first wall 21 extends. In other words, the first supporter 46 extends in the thickness direction of the first wall 21 (the thickness direction of the board 12). The first supporter 46 is, for example, a claw formed by bending the leading end of the first wall 21.

As illustrated in FIG. 4, the first supporter 46 is provided at a position that is away from the space between the board 12 and the first wall 21. The first supporter 46 faces the first end 12a of the board 12 in a direction (the insertion direction of the external terminal 28) substantially parallel to the first wall 21. The first supporter 46 comes into contact with the first end 12a of the board 12 and supports the first end 12a of the board 12 in the direction substantially parallel to the first wall 21. That is, the first supporter 46 supports the first end 12a of the board 12 such that the board 12 does not come off from the first opening 25.

As illustrated in FIG. 3, the first supporter 46 has a bonding portion at the center thereof in the width direction, similarly to the first wall 21. That is, the first supporter 46 is formed by bonding two end portions of a plate forming the housing 11 when the plate is bent in a cylindrical shape.

As illustrated in FIGS. 2 and 3, the first supporter 46 includes a central portion 46a, a first protruding portion 46b, and a second protruding portion 46c. The first protruding portion 46b is adjacent to the third wall 23. The second protruding portion 46c is adjacent to the fourth wall 24. The first protruding portion 46b and the second protruding portion 46c protrude toward the second wall 22 so as to be higher than the central portion 46a.

As illustrated in FIG. 6, the first protruding portion 46b and the second protruding portion 46c are provided so as to deviate from an extension line of the terminal 36 (an insertion path of the external terminal 28). Therefore, the first protruding portion 46b and the second protruding portion 46c are less likely to hinder the insertion of the external terminal 28. The first protruding portion 46b and the second protruding portion 46c make it possible to improve the strength of the first supporter 46. In this way, it is possible to further stably support the board 12.

As illustrated in FIGS. 2 and 4, in this embodiment, the entire first supporter 46 (that is, the central portion 46a, the first protruding portion 46b, and the second protruding portion 46c) is lower than the upper surface (the surface on which the terminals 36 are provided) of the board 12. That is, the first supporter 46 is further away from the second wall 22 than the upper surface of the board 12. In addition, the first protruding portion 46b and the second protruding portion 46c may protrude from the upper surface of the board 12. In this way, it is possible to further stably support the board 12.

Next, the stopper 13 (a supporting member, a pressing member, or a fixing component) will be described in detail. As illustrated in FIG. 4, the stopper 13 is inserted into the housing 11. The stopper 13 is made of, for example, a synthetic resin, but the material forming the stopper 13 is not limited thereto. The stopper 13 includes a first portion 13a and a second portion 13b. The first portion 13a faces the second end 12b of the board 12 from the side opposite to the first supporter 46. That is, the first portion 13a faces the second end 12b of the board 12 in a direction substantially parallel to the first wall 21. The first portion 13a comes into contact with the second end 12b of the board 12 and supports the second end 12b of the board 12 in the direction substantially parallel to the first wall 21. That is, the first portion 13a supports the second end 12b of the board 12 such that the board 12 does not come off from the second opening 26.

The second portion 13b of the stopper 13 extends from the first portion 13a toward the first opening 25. The second portion 13b is disposed between the board 12 and the second wall 22. The second portion 13b is inserted between the board 12 and the second wall 22 and is interposed between the board 12 and the second wall 22. The second portion 13b has a thickness that is substantially equal to the gap between the board 12 and the second wall 22 and is fitted to the gap.

In this way, the second portion 13b supports the board 12 from the side opposite to the first wall 21. In other words, the second portion 13b supports the board 12 in the thickness direction of the board 12. In this embodiment, the second portion 13b of the stopper 13 extends from the first portion 13a toward the first opening 25 beyond the center C1 (center position) between the first protrusion 38 and the second protrusion 39.

In other words, the board 12 is interposed between the first supporter 46 and the first portion 13a of the stopper 13 and the position of the board 12 in the horizontal direction is fixed. In addition, the board 12 is interposed between the first and second protrusions 38 and 39 and the second portion 13b of the stopper 13 and the position of the board 12 in the vertical direction is fixed.

As illustrated in FIGS. 3 and 4, a recess 51 which faces the second wall 22 is provided in the stopper 13. A second supporter 52 which is engaged with the recess 51 of the stopper 13 is provided on the second wall 22. The second supporter 52 is inserted into the recess 51 and faces the stopper 13 from the side opposite to the first supporter 46. The second supporter 52 comes into contact with the recess 51 and supports the stopper 13 from the side opposite to the first supporter 46. In other words, the stopper 13 is interposed between the second end 12b of the board 12 and the second supporter 52 and the position of the stopper 13 in the horizontal direction is fixed.

Specifically, in this embodiment, the second supporter 52 is provided by cutting a portion of the second wall 22 and bending the cut portion into the housing 11. The second supporter 52 extends from the second wall 22 to the recess 51 in a direction (oblique direction) intersecting the first wall 21.

In this way, the second supporter 52 can be elastically deformed in the direction substantially parallel to the first wall 21 and the thickness direction of the first wall 21. When second supporter 52 can be elastically deformed in the direction substantially parallel to the first wall 21, the elastic deformation of the second supporter 52 makes it possible to absorb rattling (for example, component tolerance) between the first supporter 46 and the second supporter 52. When the second supporter 52 can be elastically deformed in the thickness direction of the first wall 21, the second portion of the stopper 13 can be inserted from the second opening 26 to the gap between the second wall 22 and the board 12 while elastically deforming the second supporter 52.

As illustrated in FIGS. 3 and 4, engaging portions 54 (third supporters or side stoppers) are provided in the third wall 23 and the fourth wall 24 of the housing 11. In this embodiment, the engaging portion 54 is provided by cutting a portion of the third wall 23 or the fourth wall 24 and bending the cut portion to the outside of the housing 11. For example, a pair of engaging portions 54 can be elastically deformed in the direction in which the distance therebetween is reduced.

In addition, cutouts 55 are provided in the third wall 23 and the fourth wall 24 of the housing 11. The cutout 55 extends in the insertion direction of the stopper 13. The cutout 55 is an example of a guide which guides the stopper 13. Protrusions 56 (engaging portions) which are inserted into the cutouts 55 and then guided are provided on the stopper 13.

Next, the case 3 will be described in detail. As illustrated in FIG. 1, the case 3 is connected to the housing 11. The housing 11 includes a first end 11a at which the first opening 25 is provided and a second end 11b opposite to the first end 11a. The case 3 covers the second end 11b of the housing 11 which is disposed opposite to the terminal 36.

Figure 9:
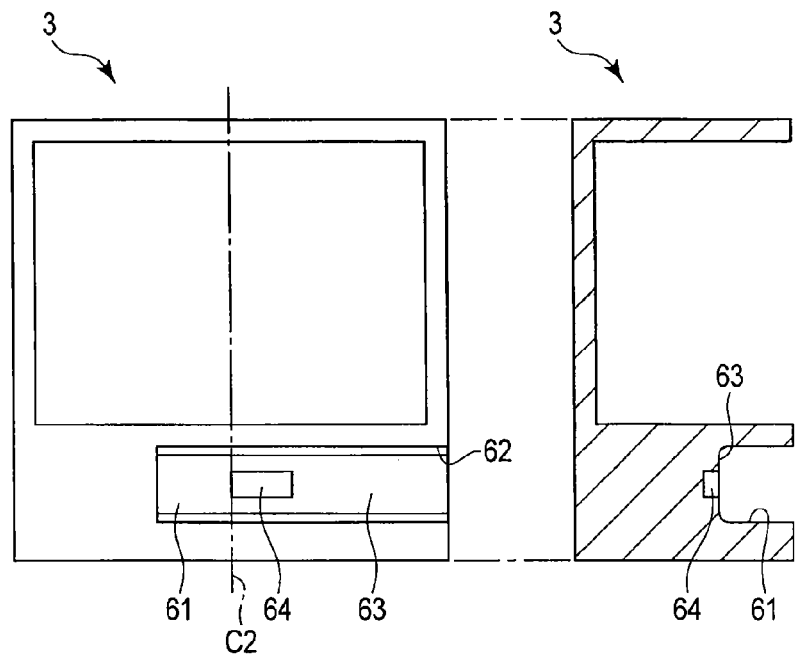
FIG. 9 is a diagram illustrating the inside of a case illustrated in FIG. 1.

FIG. 9 illustrates the inside of the case 3. As illustrated in FIG. 9, the case 3 includes an accommodation portion 61 into which the device main unit 2 is inserted and an opening 62 from which the accommodation portion 61 is exposed to the outside. The device main unit 2 is inserted into the accommodation portion 61 through the opening 62 and is attached to the case 3. The accommodation portion 61 includes, for example, a wall 63 which is arranged along the outer shape of the housing 11. Receiving portions 64 (recess) with which the engaging portions 54 of the housing 11 are engaged are provided in the inner surface of the wall 63.

The engaging portions 54 of the housing 11 are engaged with the receiving portions 64 of the case 3 such that the device main unit 2 does not come off from the case 3. That is, the leading end of the engaging portion 54 is caught in the inner surface of the recess 64. In this way, when the case 3 is drawn in a direction opposite to the insertion direction of the external terminal 28, the engaging portion 54 suppresses the disconnection between the housing 11 and the case 3. The housing 11 is inserted into the case 3 beyond the center C2 (center position) of the case 3 in the depth direction.

Next, an example of a method of assembling the semiconductor device 1 will be described.

As illustrated in FIG. 3, first, the board 12 is inserted into the housing 11 through the second opening 26. When the board 12 is inserted deep into the housing 11, the first end 12a of the board 12 comes into contact with the first supporter 46 and the board 12 is positioned.

Then, the stopper 13 is inserted into the housing 11 from the second opening 26. The second portion 13b of the stopper 13 elastically deforms the second supporter 52 and is inserted into the gap between the second wall 22 and the board 12. When the stopper 13 is inserted deep into the housing 11, the first portion 13a of the stopper 13 comes into contact with the second end 12b of the board 12 and the stopper 13 is positioned.

At that time, the second supporter 52 is inserted into the recess 51, returns from the elastically deformed state, and supports the stopper 13 from the side opposite to the first supporter 46. Therefore, the board 12 and the stopper 13 are fixed in the housing 11 and do not come off from the housing 11. In this way, the assembly of the device main unit 2 is completed.

Then, the assembled device main unit 2 is attached to the case 3. Specifically, for example, two divided case components are combined into the case 3. The device main unit 2 is inserted into the assembled case 3 from the opening 62 of the case 3. At that time, the engaging portion 54 of the housing 11 is elastically deformed.

When the device main unit 2 is inserted into the case 3 and reaches a predetermined position, the engaging portion 54 is engaged with the receiving portion 64. That is, the engaging portion 54 returns from the elastically deformed state and the leading end of the engaging portion 54 is caught in the inner surface of the receiving portion 64 in a direction opposite to the direction in which the device main unit 2 is inserted into the case 3. Therefore, the device main unit 2 is fixed to the case 3 and does not come off from the case 3. In this way, the assembly of the semiconductor device 1 is completed.

According to the semiconductor device 1 having the above-mentioned structure, it is possible to improve reliability.

For example, the SiP board module can reduce the size and costs of the semiconductor device. However, when the SiP board module is used without any change in shape, strength is likely to be insufficient. Therefore, it is considered that the board module is arranged in a housing made of, for example, a metal material.

Here, a semiconductor device without the first supporter 46 and the stopper 13 is considered for comparison. In this case, the board 12 is fixed to the inner surface of the housing 11 by, for example, an adhesive. When the board is fixed by the adhesive, insertion stability or environmental reliability needs to be improved in use. In addition, when the adhesive is used, manufacturing processes or costs are likely to increase.

The semiconductor device 1 according to this embodiment includes the housing 11, the board 12, the first supporter 46, the stopper 13, and the second supporter 52. The housing 11 includes the first wall 21 and the second wall 22 opposite to the first wall 21. The board 12 is disposed in the housing 11. The first supporter 46 is provided on the first wall 21 and supports the end of the board 12. The stopper 13 is disposed in the housing 11 and supports the board 12. The second supporter 52 is provided on the second wall 22 and supports the stopper 13.

According to this structure, the first supporter 46, the stopper 13, and the second supporter 52 make it possible to easily fix the board 12 without using an adhesive. In this way, it is possible to easily improve the reliability of the semiconductor device 1 at a low cost.

In this embodiment, the stopper 13 supports the board 12 from the side opposite to the first supporter 46. According to this structure, it is possible to further stably support the board 12.

In this embodiment, the board 12 includes the terminal 36 which can contact the external terminal 28 inserted through the first opening 25 of the housing 11. According to this structure, it is possible to stably support the board 12 to which force is applied when the external terminal 28 is inserted or removed.

In this embodiment, the second portion 13b of the stopper 13 is disposed between the board 12 and the second wall 22 and supports the board 12 from the side opposite to the first wall 21. According to this structure, the position of the board 12 in the vertical direction is fixed by the stopper 13. In this way, it is possible to further stably support the board 12.

In this embodiment, the semiconductor device 1 includes the first and second protrusions 38 and 39. The first protrusion 38 is provided in at least one of the first wall 21 and the board 12 and separates the board 12 from the first wall 21. The second protrusion 39 is provided in at least one of the first wall 21 and the board 12 between the first protrusion 38 and the first opening 25 and separates the board 12 from the first wall 21. The second portion 13b of the stopper 13 extends from the first portion 13a to the first opening 25 so as to pass through the center between the first protrusion 38 and the second protrusion 39. According to this structure, stress applied from the second portion 13b of the stopper 13 to the board 12 is effectively dispersed to the first protrusion 38 and the second protrusion 39. Therefore, even when strong external force is applied to the semiconductor device 1, it is possible to prevent the damage of the board 12.

In this embodiment, the recess 51 which faces the second wall 22 is provided in the stopper 13. The second supporter 52 is inserted into the recess 51 of the stopper 13 and faces the stopper 13 from the side opposite to the first supporter 46. According to this structure, the first supporter 46 and the second supporter 52 make it possible to stably support the stopper 13.

In this embodiment, the second supporter 52 extends toward the recess 51 in the direction intersecting the first wall 21 and can be elastically deformed in the direction substantially parallel to the first wall 21. According to this structure, the elastic deformation of the second supporter 52 makes it possible to reduce rattling (for example, component tolerance) between the first supporter 46 and the second supporter 52.

Next, modifications of the first embodiment will be described with reference to FIGS. 10 to 13. In the modifications, components having the same or similar functions as the above-mentioned components are denoted by the same reference numerals and the description thereof will not be repeated. Structures other the following structures are the same as the above-mentioned structures.

Figure 10:
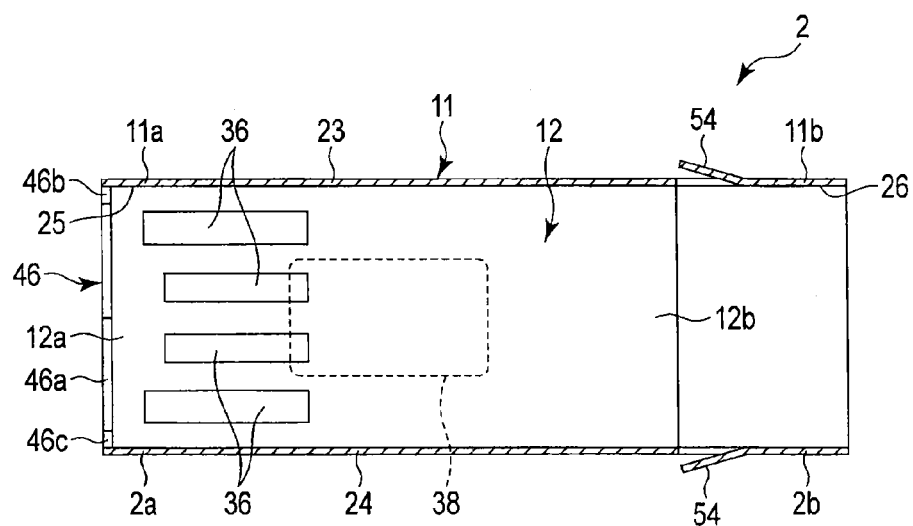
FIG. 10 is a cross-sectional view illustrating a device main unit according to a first modification of the first embodiment.

FIG. 10 illustrates a first modification. In the first modification, instead of the first protrusion 38 and the second protrusion 39, a protrusion 38 having a substantially rectangular shape is provided on the first wall 21. The protrusion 38 supports the board 12 from the lower side and increases the height of the terminal 36, similarly to the first protrusion 38 and the second protrusion 39.

Figure 11:
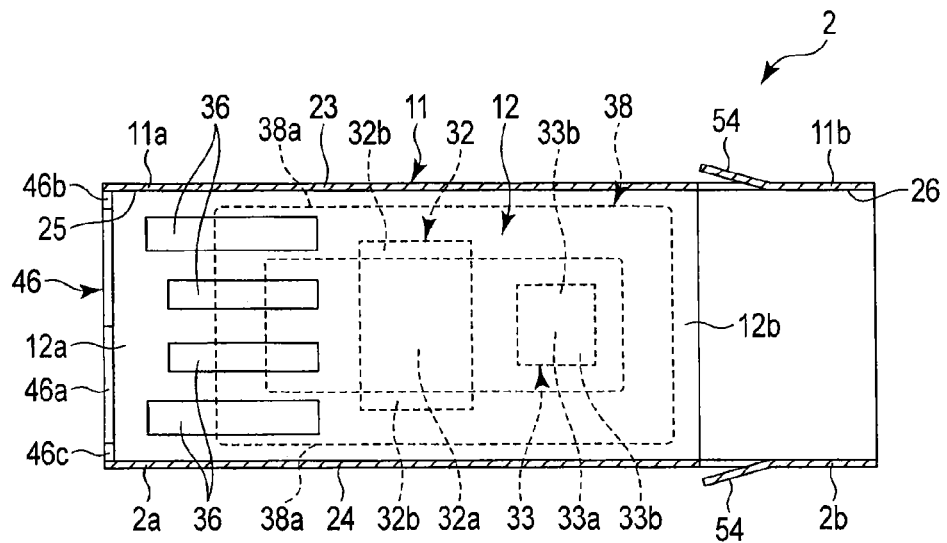
FIG. 11 is a cross-sectional view illustrating a device main unit according to a second modification of the first embodiment.

FIG. 11 illustrates a second modification. In the second modification, instead of the first protrusion 38 and the second protrusion 39, a protrusion 38 having a frame shape (or an O-shape) is provided on the first wall 21. The protrusion 38 has a shape in which the four first and second protrusions 38 and 39 are connected in a frame shape, for example. The frame-shaped protrusion 38 includes two stretching portions 38a (straight portions) which extends in the longitudinal direction of the housing 11. When the portions which extend in the longitudinal direction of the housing 11 are provided in the protrusion 38, it is possible to increase the strength of the housing 11.

As illustrated in FIG. 11, a semiconductor chip 32 provided on the board 12 includes a central portion 32a and an edge portion 32b. The central portion 32a has low external stress resistance than the edge portion 32b. In this embodiment, the protrusion 38 is provided at a position where it does not overlap the central portion 32a of the semiconductor chip 32. In this embodiment, the protrusion 38 overlaps the edge portion 32b of the semiconductor chip 32. The protrusion 38 may not overlap the edge portion 32b of the semiconductor chip 32. That is, the protrusion 38 may be provided at a position that is away from the entire semiconductor chip 32.

Similarly, a controller chip 33 includes a central portion 33a and an edge portion 33b. The central portion 33a has low external stress resistance than the edge portion 33b. In this embodiment, the protrusion 38 is provided at a position where it does not overlap the entire controller chip 33. The edge portion 33b of the controller chip 33 may not overlap the protrusion 38.

The semiconductor chip 32 and the controller chip 33 have a relative large area among the components forming the board 12. Therefore, stress is likely to be applied to the semiconductor chip 32 and the controller chip 33, and the semiconductor chip 32 and the controller chip 33 are likely to be damaged. However, according to this structure, even when a large amount of stress is applied to the semiconductor device 1 from the outside, stress is less likely to be applied to the central portion 32a of the semiconductor chip 32 and the central portion 33a of the controller chip 33. Therefore, it is possible to prevent the damage of the semiconductor chip 32 and the controller chip 33. The above-mentioned structure may be applied to any component other than the semiconductor chip 32 and the controller chip 33.

Figure 12:
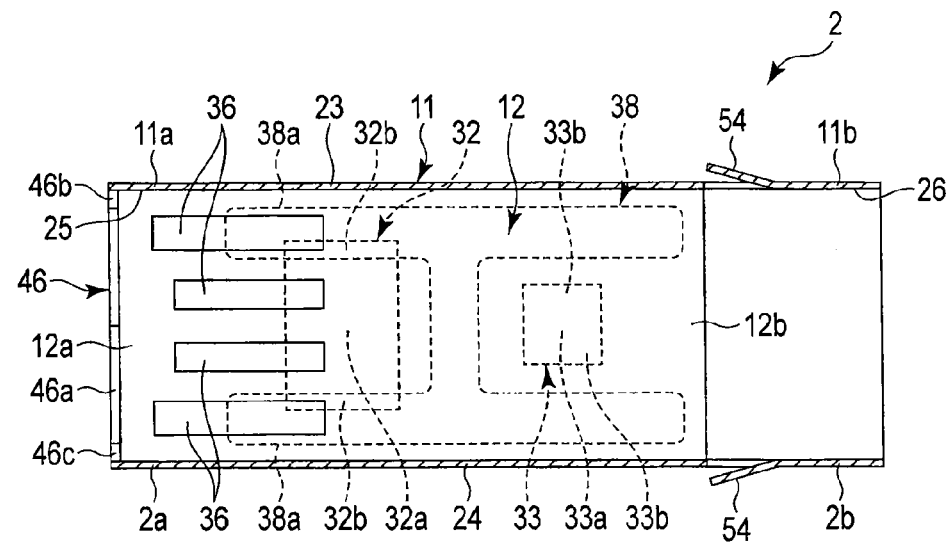
FIG. 12 is a cross-sectional view illustrating a device main unit according to a third modification of the first embodiment.

FIG. 12 illustrates a third modification. In the third modification, instead of the first protrusion 38 and the second protrusion 39, an H-shaped protrusion 38 is provided on the first wall 21. For example, the protrusion 38 has a shape in which the four first and second protrusions 38 and 39 are connected in an H-shape.

Figure 13:
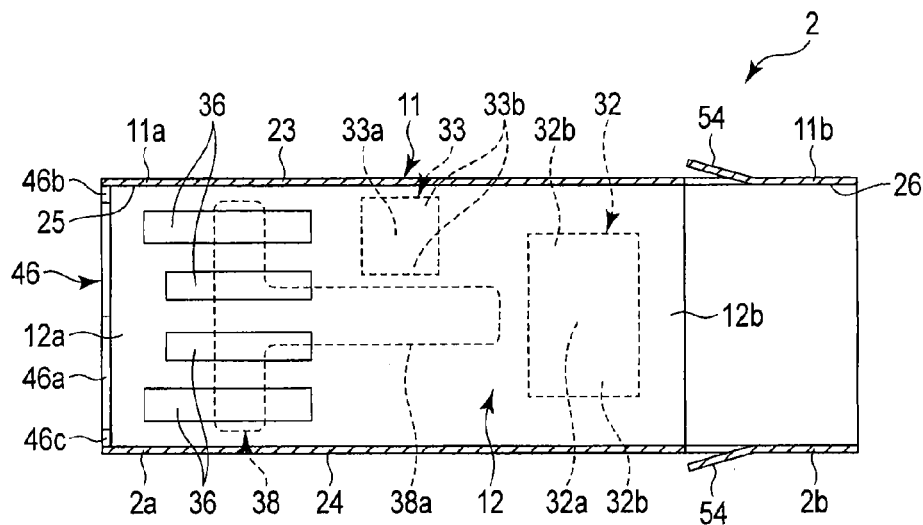
FIG. 13 is a cross-sectional view illustrating a device main unit according to a fourth modification of the first embodiment.

FIG. 13 illustrates a fourth modification. In the fourth modification, instead of the first protrusion 38 and the second protrusion 39, a T-shaped one protrusion 38 is provided on the first wall 21. For example, the protrusion 38 has a shape in which the four first and second protrusions 38 and 39 are connected in a T-shape.

In these structures, it is possible to obtain the same operation and effect as those in the second modification. The protrusion 38 is not limited to the above-mentioned shapes, but may have, for example, a U-shape or other shapes. In these modifications, the protrusion 38 is provided on the first wall 21. However, the embodiments are not limited thereto. For example, the protrusion 38 may be provided on the board 12, instead of the first wall 21 or in addition to the first wall 21.

Next, a fifth modification will be described with reference to FIG. 14. In the fifth modification, the first and second protrusions 38 and 39 are configured by components 71 which are provided on the board 12. Specifically, the components 71 are mounted on the first surface 31a of the substrate 31. The component 71 is, for example, an electronic component, but is not limited thereto. An example of the component 71 is a dummy component which is not electrically connected to the wiring pattern of the substrate 31. The component 71 may be an individual piece made of a metal material or a synthetic resin. The component 71 has a relatively large height. For example, the component 71 has a height that is more than the thickness T of the sealing resin 35.

Figure 14:
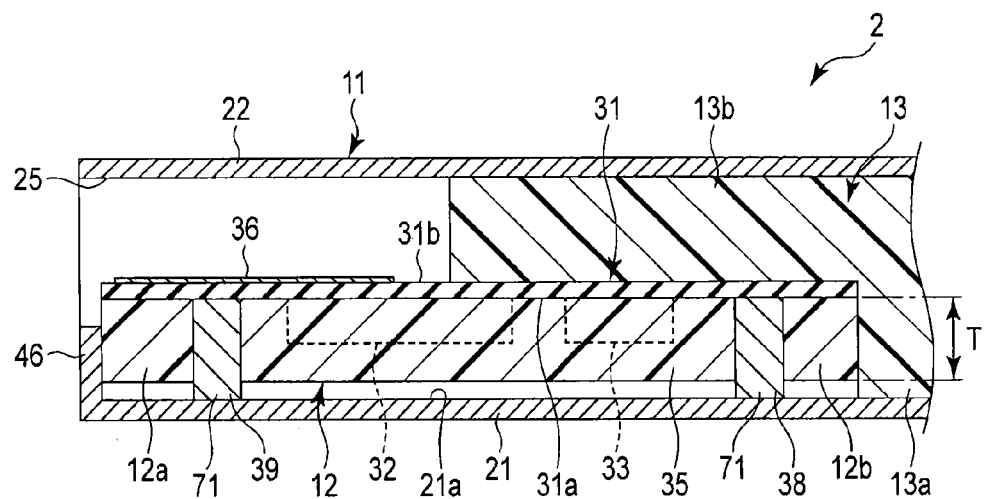
FIG. 14 is a cross-sectional view illustrating a device main unit according to a fifth modification of the first embodiment.

As illustrated in FIG. 14, the sealing resin 35 covers the semiconductor chip 32 and the controller chip 33 and also covers a base portion of the component 71. The leading end of the component 71 protrudes toward the outside of the sealing resin 35 in the thickness direction of the board 12 and is exposed to the outside of the board 12. The leading end of the component 71 comes into contact with the inner surface of the first wall 21. Therefore, the sealing resin 35 is separated from the first wall 21 and is provided in the gap between the sealing resin 35 and the first wall 21. In this way, similarly to when the first and second protrusions 38 and 39 are provided, the terminals 36 of the board 12 are lifted up.

Figure 15:
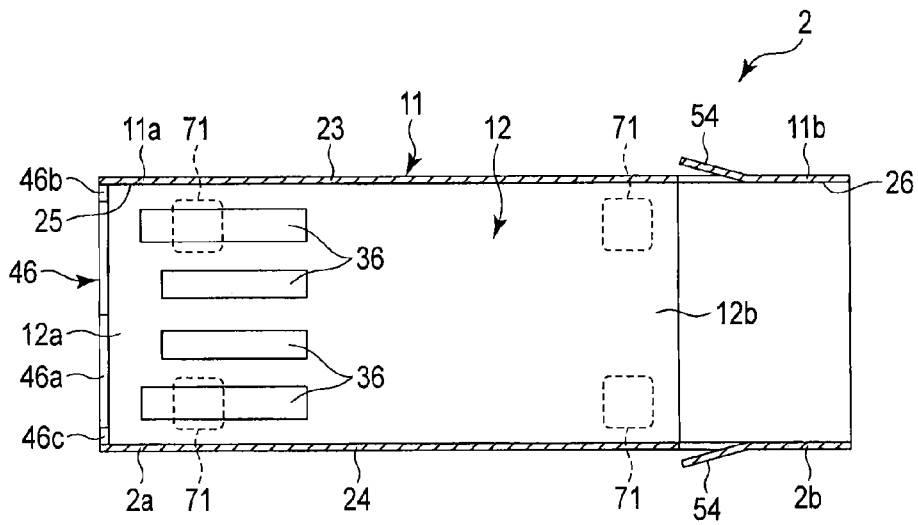
FIG. 15 is a cross-sectional view illustrating the device main unit illustrated in FIG. 14.

As illustrated in FIG. 15, for example, a plurality of (for example, four) components 71 are provided, but the number of components is not limited to four. For example, only one component 71 may be provided. In this modification, the components 71 are mounted on the first surface 31a of the substrate 31. However, the embodiments are not limited thereto. For example, the components 71 may be attached to the sealing resin 35. When the components 71 are mounted on the first surface 31a of the substrate 31, it is possible to stably fix the components 71 with, for example, solder or an adhesive. For example, when the component 71 has a metal portion, the component 71 may be fixed to a conductor portion of the second surface 31b of the substrate 31 by soldering in the same mounting process as that for mounting other components (for example, the semiconductor chip 32 and the controller chip 33).

Second Embodiment

Next, a semiconductor device 1 according to a second embodiment will be described with reference to FIG. 16. In the second embodiment, components having the same or similar functions as those in the first embodiment are denoted by the same reference numerals and the description thereof will not be repeated. In addition, structures other than the following structures are the same as those in the first embodiment.

Figure 16:
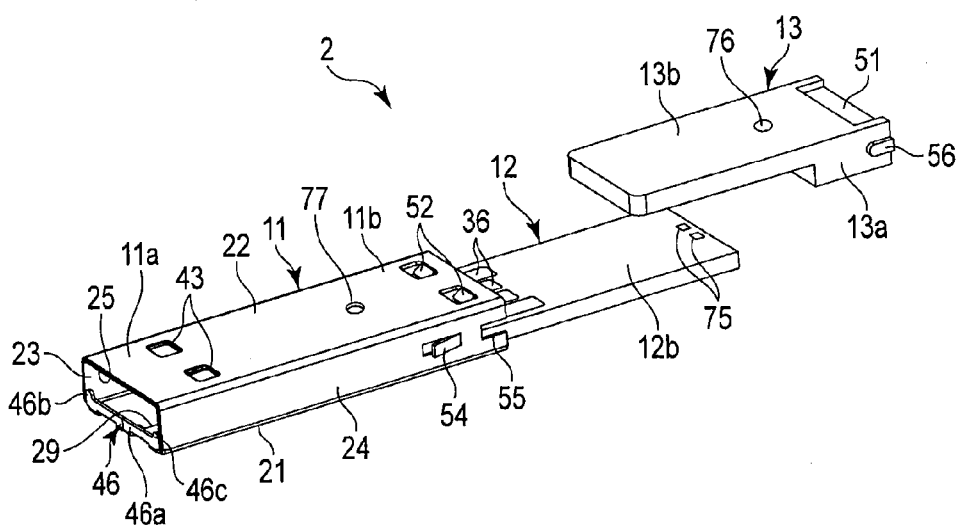
FIG. 16 is an exploded perspective view illustrating a portion of a device main unit according to a second embodiment.

As illustrated in FIG. 16, in this embodiment, an electronic component 76 is provided in a stopper 13. The electronic component 76 is, for example, an LED. The LED is controlled so as to be turned on or off, for example, during data communication. Terminals 75 which face the stopper 13 are provided on a board 12. The electronic component 76 is electrically connected to the terminals 75 of the board 12. An opening 77 from which the electronic component 76 is exposed to the outside is provided in a housing 11.

According to this structure, similarly to the first embodiment, it is possible to improve the reliability of the semiconductor device 1. In addition, in this embodiment, the electronic component 76 is provided in the stopper 13. Therefore, it is possible to improve the function of the semiconductor device 1.

Third Embodiment

Next, a semiconductor device 1 according to a third embodiment will be described with reference to FIG. 17. In the third embodiment, components having the same or similar functions as those in the first embodiment are denoted by the same reference numerals and the description thereof will not be repeated. In addition, structures other than the following structures are the same as those in the first embodiment.

As illustrated in FIG. 17, in this embodiment, a stopper 13 is formed by a portion of a second wall 22. That is, the second wall 22 includes a first portion 13a and a second portion 13b. The first portion 13a comes into contact with a second end 12b of a board 12 from the side opposite to a first supporter 46 and supports the second end 12b of the board 12. The second portion 13b comes into contact with the board 12 from the side opposite to a first wall 21 and supports the board 12. The first portion 13a and the second portion 13b are formed by cutting portions of the second wall 22 and bending the cut portions into a housing 11.

According to this structure, similarly to the first embodiment, it is possible to improve the reliability of the semiconductor device 1. In addition, according to this embodiment, it is possible to omit a stopper, which is a separate component, and thus reduce the number of components.

Fourth Embodiment

Next, a semiconductor device 1 according to a fourth embodiment will be described with reference to FIGS. 18 and 19. In the fourth embodiment, components having the same or similar functions as those in the first embodiment are denoted by the same reference numerals and the description thereof will not be repeated. In addition, structures other than the following structures are the same as those in the first embodiment.

Figure 19:
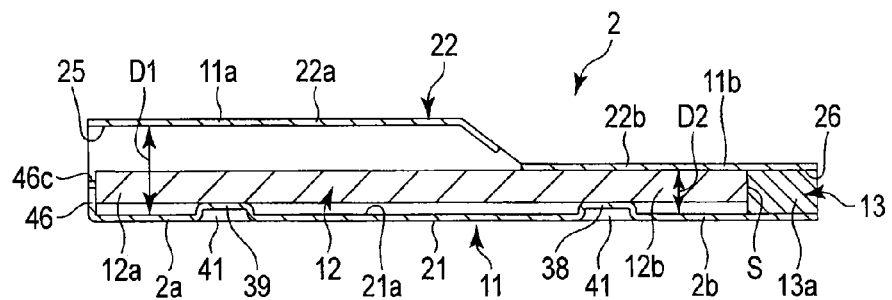
FIG. 19 is a cross-sectional view illustrating the device main unit illustrated FIG. 18.

As illustrated in FIGS. 18 and 19, in this embodiment, a second end 2b of a device main unit 2 is thinner than a first end 2a. Specifically, a second end 11b of a housing 11 is thinner than a first end 11a.

Specifically, a second wall 22 of the housing 11 includes a first portion 22a and a second portion 22b. A first distance D1 (first gap) between the first portion 22a and a first wall 21 is set to a predetermined value corresponding to, for example, the USB standard illustrated in FIG. 8.

The second portion 22b is closer to the first wall 21 than the first portion 22a. That is, a second distance D2 (second gap) between the second portion 22b and the first wall 21 is less than the first distance D1 between the first portion 22a and the first wall 21. For example, the second portion 22b comes into contact with a board 12 from the side opposite to the first wall 21 and supports the board 12 from the side opposite to the first wall 21. In other words, the board 12 is interposed between first and second protrusions 38 and 39 and the second portion 22b of the second wall 22 and the position of the board 12 in the vertical direction is fixed.

A stopper 13 according to this embodiment includes, for example, a portion (that is, a second portion 13b) which is interposed between the board 12 and the second wall 22. When there is a gap between the second portion 22b of the second wall 22 and the board 12, the stopper 13 may include the second portion 13b which is inserted between the second portion 22b of the second wall 22 and the board 12.

According to this structure, similarly to the first embodiment, it is possible to improve the reliability of the semiconductor device 1. In addition, in this embodiment, the second end 11b of the housing 11 is thinner than the first end 11a. According to this structure, it is possible to thin or omit the second portion 13b of the stopper 13, as compared to the first embodiment. When the second portion 13b can be thinned or omitted, it is possible to reduce the material costs of the stopper 13. That is, according to this embodiment, it is possible to reduce the costs of the semiconductor device 1.

Fifth Embodiment

Next, a semiconductor device 1 according to a fifth embodiment will be described with reference to FIGS. 20 and 21. In the fifth embodiment, components having the same or similar functions as those in the first embodiment are denoted by the same reference numerals and the description thereof will not be repeated. In addition, structures other than the following structures are the same as those in the first embodiment.

Figure 20:
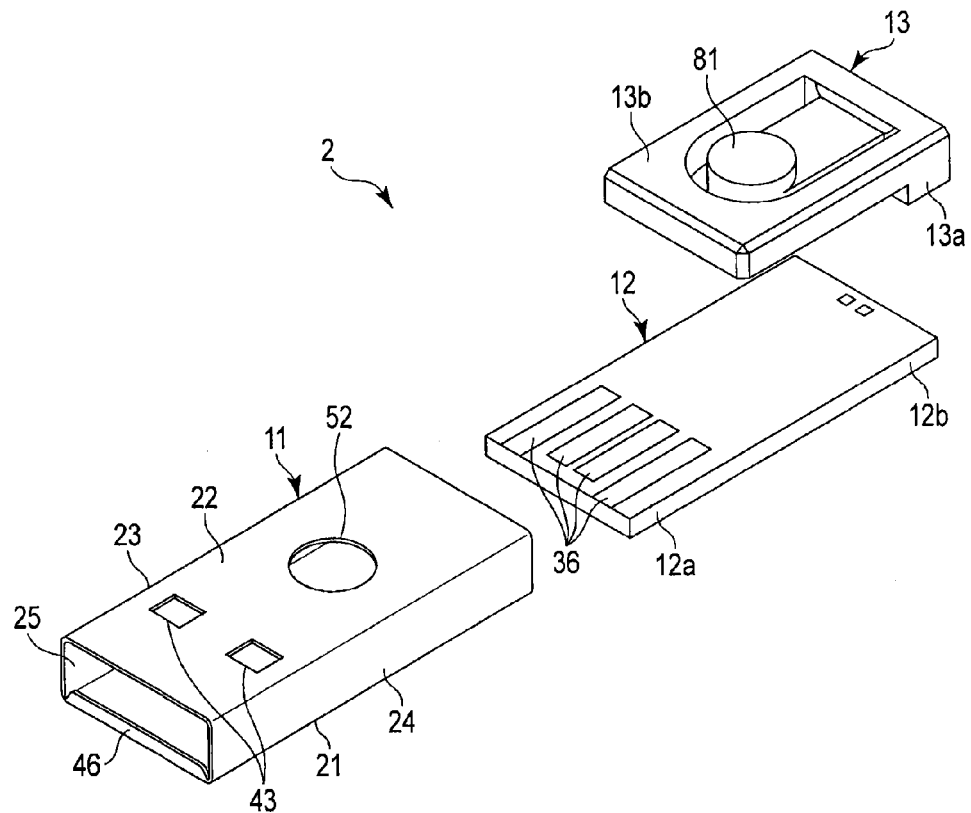
FIG. 20 is an exploded perspective view illustrating a portion of a semiconductor device according to a fifth embodiment.
Figure 21:
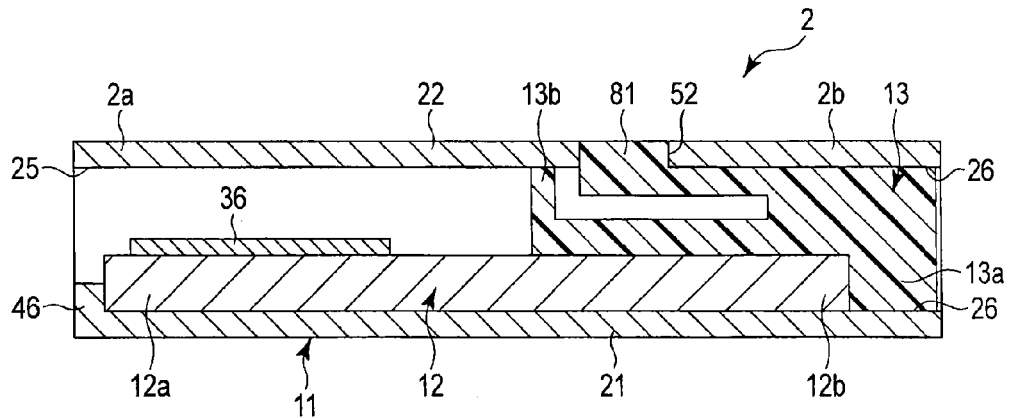
FIG. 21 is a cross-sectional view illustrating the semiconductor device illustrated in FIG. 20.

As illustrated in FIGS. 20 and 21, in this embodiment, a second supporter 52 is an opening which is provided in a second wall 22. A stopper 13 includes an engaging portion 81 which is engaged with the second supporter 52. The engaging portion 81 can be elastically deformed in, for example, the vertical direction.

The engaging portion 81 is elastically deformed and the stopper 13 is inserted into a housing 11. When the engaging portion 81 is engaged with the second supporter 52, it returns from the elastically deformed state and is engaged with the second supporter 52. In this way, the second supporter 52 supports the stopper 13 from the side opposite to a first supporter 46.

According to this structure, similarly to the first embodiment, it is possible to improve the reliability of the semiconductor device 1.

Sixth Embodiment

Next, a semiconductor device 1 according to a sixth embodiment will be described with reference to FIGS. 22 and 23. In the sixth embodiment, components having the same or similar functions as those in the first to fifth embodiments are denoted by the same reference numerals and the description thereof will not be repeated. In addition, structures other than the following structures are the same as those in the fifth embodiment.

Figure 22:
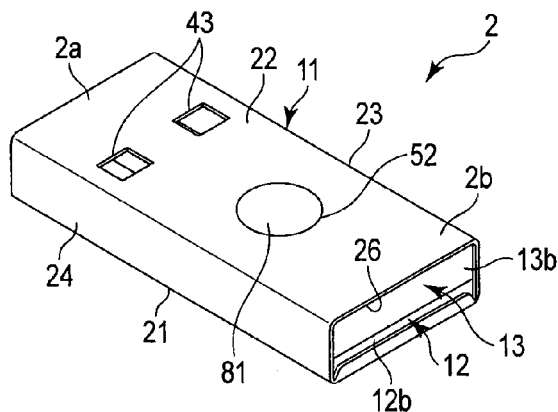
FIG. 22 is a perspective view illustrating a semiconductor device according to a sixth embodiment.
Figure 23:
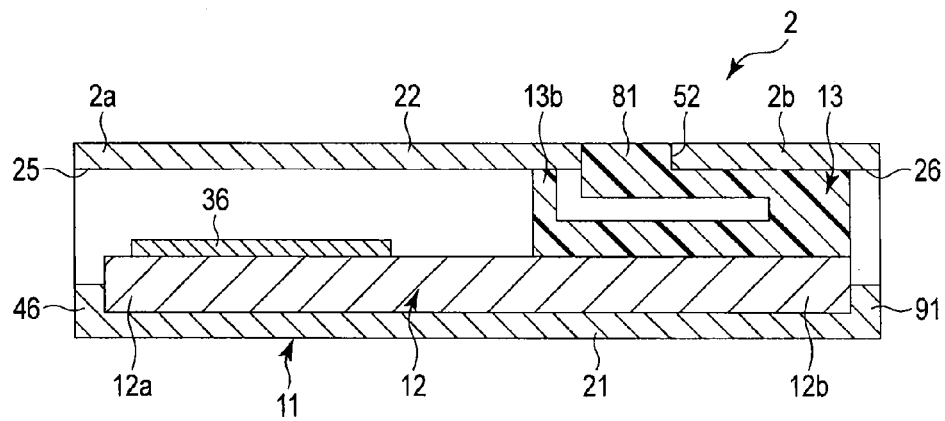
FIG. 23 is a cross-sectional view illustrating the semiconductor device illustrated in FIG. 22.

As illustrated in FIGS. 22 and 23, a stopper 13 according to this embodiment does not include a first portion 13a. A first wall 21 of a housing 11 includes, for example, a third supporter 91 at a second end 11b of the housing 11. The third supporter 91 protrudes from the first wall 21 in a direction (for example, a direction substantially perpendicular to) intersecting the direction in which the first wall 21 extends. In other words, the third supporter 91 extends in the thickness direction of the board 12. The third supporter 91 is, for example, a claw formed by bending the end of a first wall 21.

The third supporter 91 is provided in a region which deviates from a space between a board 12 and the first wall 21. The third supporter 91 faces a second end 12b of the board 12 in a direction substantially parallel to the first wall 21. The third supporter 91 comes into contact with the second end 12b of the board 12 and supports the second end 12b of the board 12 in the direction substantially parallel to the first wall 21. The third supporter 91 supports the board 12 from the side opposite to the first supporter 46. That is, the third supporter 91 supports the second end 12b of the board 12 such that the board 12 does not come off from a second opening 26. The board 12 is interposed between the first supporter 46 and the third supporter 91 and the position of the board 12 in the horizontal direction is fixed.

According to this structure, similarly to the first embodiment, it is possible to improve the reliability of the semiconductor device 1. In addition, similarly to the first embodiment, a case 3 may be provided in the fifth and sixth embodiments.

According to the structures of the first to sixth embodiments, it is possible to improve the reliability of the semiconductor device 1. The embodiments have been described with reference to the drawings corresponding to the semiconductor device based on the USB 2.0 standard. However, these embodiments can also be applied to semiconductor devices based on a USB 3.0 standard or other standards. In addition, the components according to the above-described embodiments may be combined with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a housing comprising a first wall, a second wall opposite to the first wall, and an opening between the first wall and the second wall;
    a board extending between the first wall and the second wall in the housing, the board comprises a terminal configured to contact an external terminal inserted through the opening;
    a first supporter provided on the first wall and configured to support an end of the board in a direction substantially parallel to the first wall;
    a stopper in the housing, the stopper comprising a first portion configured to support the board from a side opposite to the first supporter;
    a second supporter provided on the second wall and configured to support the stopper from the side opposite to the first supporter;
    a cover connected to the housing and covering an end of the housing opposite to the terminal; and
    a third supporter provided on the housing and configured to suppress a disconnection between the housing and the cover when the cover is drawn in a direction opposite to an insertion direction of the external terminal.

2. The device according to claim 1, wherein the stopper comprises a second portion located between the board and the second wall, the second portion configured to support the board from a side opposite to the first wall.

3. The device according to claim 2, further comprising:
    a first protrusion provided on at least one of the first wall and the board and configured to separate the board from the first wall; and
    a second protrusion provided on at least one of the first wall and the board, the second protrusion located between the first protrusion and the opening and configured to separate the board from the first wall, wherein
    the second portion of the stopper extends from the first portion toward the opening beyond a center between the first protrusion and the second protrusion.

4. The device according to claim 1, wherein
    the stopper comprises a recess facing the second wall, and
    the second supporter configured to be inserted into the recess and face the stopper from the side opposite to the first supporter.

5. The device according to claim 4, wherein the second supporter extends toward the recess in a direction inclined with respect to the first wall and configured to be elastically deformed in the direction substantially parallel to the first wall.

6. The device according to claim 5, wherein the second supporter is formed by bending a portion of the second wall into the housing.

7. A semiconductor device comprising:
    a housing comprising a first wall and a second wall opposite to the first wall;
    a board in the housing, wherein:

the board comprises a substrate, a semiconductor chip on the substrate, and a sealing resin that seals the semiconductor chip;

the board further comprises a terminal and a component, the terminal configured to be exposed to an outside of the board and face the second wall, the component mounted on the substrate; and an end of the component protrudes toward an outside of the sealing resin in a thickness direction of the board, the end of the component configured to come into contact with the first wall and separate the sealing resin from the first wall;

a first supporter provided on the first wall and configured to support an end of the board in a direction substantially parallel to the first wall;

a stopper in the housing, the stopper configured to support the board; and a second supporter provided on the second wall and configured to support the stopper.

8. The device according to claim 7, wherein the stopper is configured to support the board from a side opposite to the first supporter.

9. The device according to claim 7, further comprising:

a third supporter provided on the first wall and configured to support the board from a side opposite to the first supporter.

* * * * *